US012131779B2

United States Patent
Akerib et al.

(10) Patent No.: US 12,131,779 B2
(45) Date of Patent: *Oct. 29, 2024

(54) GLOBAL RESPONDER SIGNAL CIRCUITRY FOR MEMORY ARRAYS

(71) Applicant: GSI Technology Inc., Sunnyvale, CA (US)

(72) Inventors: Avidan Akerib, Tel Aviv (IL); Eli Ehrman, Beit Shemesh (IL)

(73) Assignee: GSI Technology Inc., Sunnyvale, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 18/328,895

(22) Filed: Jun. 5, 2023

(65) Prior Publication Data

US 2023/0317165 A1  Oct. 5, 2023

Related U.S. Application Data

(63) Continuation of application No. 17/384,873, filed on Jul. 26, 2021, now Pat. No. 11,670,369, which is a continuation of application No. 15/839,976, filed on Dec. 13, 2017, now Pat. No. 11,074,973, which is a continuation of application No. 14/594,434, filed on Jan. 12, 2015, now Pat. No. 9,859,005.

(60) Provisional application No. 62/019,486, filed on Jul. 1, 2014, provisional application No. 61/926,347, filed on Jan. 12, 2014.

(51) Int. Cl.
*G11C 15/00* (2006.01)
*G11C 15/04* (2006.01)

(52) U.S. Cl.
CPC .......... *G11C 15/00* (2013.01); *G11C 15/046* (2013.01)

(58) Field of Classification Search
None
See application file for complete search history.

(56) References Cited

U.S. PATENT DOCUMENTS

| | | | |
|---|---|---|---|
| 5,444,649 A | 8/1995 | Nemirovsky |
| 5,893,088 A | 4/1999 | Hendricks |
| 8,238,173 B2 | 8/2012 | Akerib |
| 8,634,247 B1 | 1/2014 | Sprouse |
| 8,711,638 B2 | 4/2014 | Akerib |
| 8,730,750 B1 | 5/2014 | Trivedi |
| 8,908,465 B2 | 12/2014 | Akerib |
| 9,076,527 B2 | 7/2015 | Agam |

(Continued)

*Primary Examiner* — Eric J Yoon
*Assistant Examiner* — Marwan Ayash
(74) *Attorney, Agent, or Firm* — Heidi Brun Associates Ltd.

(57) ABSTRACT

A memory device includes a plurality of memory units and a global responder (RSP) unit. Each memory unit includes a memory array of memory cells arranged in rows and columns, and an RSP unit. The memory array receives horizontal input data rotated for storage as data candidates in columns of the array. At least one of the rows is a calculation row receiving per-bit-line Boolean AND operations between bits of a marker row and bits of a row of data of the data candidates. The RSP unit includes wired-OR circuitry operative on the calculation row to generate a responder signal indicating whether there is one cell in the calculation row having a predefined value identifying a data candidate in the memory array. The global RSP unit receives multiple responder signals, one from at least two of the RSP units, and performs Boolean OR operations on the multiple responder signals.

5 Claims, 7 Drawing Sheets

MARKERS

| iter | MC1 | MC2 | MC3 | MC4 | MC5 | MC6 | RSP | MCj(new) |
|---|---|---|---|---|---|---|---|---|
| 1st | 1 | 1 | 1 | 1 | 1 | 1 | 1 | |
| 2nd | 1 | 1 | 0 | 1 | 1 | 1 | 1 | R1*M(1st) |
| 3rd | 0 | 1 | 0 | 1 | 0 | 0 | 1 | R2*M(2nd) |
| 4th | 0 | 0 | 0 | 0 | 0 | 0 | 0 | R3*M(3rd) |
| 5th | 0 | 1 | 0 | 0 | 0 | 0 | 1 | R4*M(3rd) |

(56) References Cited

U.S. PATENT DOCUMENTS

| | | |
|---|---|---|
| 9,146,808 B1 | 9/2015 | Butler |
| 9,384,790 B2 | 7/2016 | Trivedi |
| 9,418,719 B2 | 8/2016 | Akerib |
| 9,859,005 B2 | 1/2018 | Akerib |
| 11,074,973 B2 | 7/2021 | Akerib |
| 11,670,369 B2 | 6/2023 | Akerib |
| 2009/0190404 A1 | 7/2009 | Roohparvar |
| 2011/0013442 A1 | 1/2011 | Akerib |
| 2012/0246380 A1 | 9/2012 | Akerib |
| 2014/0082176 A1 | 3/2014 | Basso |
| 2014/0133233 A1 | 5/2014 | Li |
| 2014/0133237 A1 | 5/2014 | Sprouse |
| 2014/0136761 A1 | 5/2014 | Li |
| 2014/0136762 A1 | 5/2014 | Li |
| 2014/0136763 A1 | 5/2014 | Li |
| 2014/0136764 A1 | 5/2014 | Li |
| 2015/0131383 A1 | 5/2015 | Akerib |
| 2018/0018566 A1 | 1/2018 | Ehrman |
| 2019/0065186 A1 | 2/2019 | Lazer |

102 → 112 ↓ DATA BITS ← 111 ← 100

|     | C1 | C2 | C3 | C4 | C5 | C6 |
|-----|----|----|----|----|----|----|
| R1  | 1  | 1  | 0  | 1  | 1  | 1  |
| R2  | 0  | 1  | 0  | 1  | 0  | 0  |
| R3  | 1  | 0  | 0  | 0  | 1  | 0  |
| R4  | 0  | 1  | 0  | 0  | 1  | 1  |
| R5  | 0  | 0  | 0  | 1  | 0  | 1  |
| R6  | 1  | 1  | 0  | 1  | 0  | 1  |
| R7  | 0  | 0  | 0  | 1  | 1  | 1  |
| R8  | 1  | 1  | 1  | 1  | 1  | 0  |

113 → (points to R4 row); 106 ← (points to column C6 area)

FIGURE 4

MARKERS

| iter | MC1 | MC2 | MC3 | MC4 | MC5 | MC6 | RSP | MCj(new) |
|------|-----|-----|-----|-----|-----|-----|-----|----------|
| 1st  | 1   | 1   | 1   | 1   | 1   | 1   | 1   |          |
| 2nd  | 1   | 1   | 0   | 1   | 1   | 1   | 1   | R1*M(1st) |
| 3rd  | 0   | 1   | 0   | 1   | 0   | 0   | 1   | R2*M(2nd) |
| 4th  | 0   | 0   | 0   | 0   | 0   | 0   | 0   | R3*M(3rd) |
| 5th  | 0   | 1   | 0   | 0   | 0   | 0   | 1   | R4*M(3rd) |

122 → (points to the "1" in MC2 column, 5th row)

FIGURE 5A

MARKERS

| | iter | MC1 | MC2 | MC3 | MC4 | MC5 | MC6 | RSP | MCj(new) |
|---|---|---|---|---|---|---|---|---|---|
| 118 → | 1st | 1 | 0 | 1 | 1 | 1 | 1 | 1 | |
| 120 → | 2nd | 1 | 0 | 0 | 1 | 1 | 1 | 1 | R1*M(1st) |
| | 3rd | 0 | 0 | 0 | 1 | 0 | 0 | 1 | R2*M(2nd) |

102 → iter ; 108 → ; 124 → MC2 (1st row); 126 → MC4 (3rd row); 100 →

FIGURE 5B

MARKERS

| | iter | MC1 | MC2 | MC3 | MC4 | MC5 | MC6 | RSP | MCj(new) |
|---|---|---|---|---|---|---|---|---|---|
| 118 → | 1st | 1 | 0 | 1 | 0 | 1 | 1 | 1 | |
| 120 → | 2nd | 1 | 0 | 0 | 0 | 1 | 1 | 1 | R1*M(1st) |
| | 3rd | 0 | 0 | 0 | 0 | 0 | 0 | 0 | R2*M(2nd) |
| | 4th | 1 | 0 | 0 | 0 | 1 | 0 | 1 | R3*M(2nd) |
| | 5th | 0 | 0 | 0 | 0 | 1 | 0 | 1 | R4*M(4th) |

GLOBAL RESPONDER SIGNAL CIRCUITRY FOR MEMORY ARRAYS

CROSS-REFERENCE TO RELATED APPLICATIONS

This application is a continuation application of U.S. Ser. No. 17/384,873, filed Jul. 26, 2021, which is a continuation application of U.S. Ser. No. 15/839,976, filed Dec. 13, 2017, which is a continuation application of U.S. patent application Ser. No. 14/594,434, filed Jan. 12, 2015, which claims benefit from U.S. Provisional Patent Application No. 61/926,347, filed Jan. 12, 2014, and from U.S. Provisional Patent Application No. 62/019,486, filed Jul. 1, 2014, all of which are hereby incorporated in their entirety by reference.

FIELD OF THE INVENTION

The present invention relates to memory devices generally and to a method and device for sorting data stored in memory devices in particular.

BACKGROUND OF THE INVENTION

Content addressable memories (CAMs) are generally used to compare input data to data stored in a memory array, and to return an indication associated with a matching of the input data to the stored data. This indication may include the matching memory location. CAMs are frequently used in applications which require relatively fast data searching or pattern matching, such as, for example, in database storage, network routing, speech processing, image processing, among other numerous applications.

CAMs are generally divided into two groups, binary CAMs and ternary CAMS (T-CAMs). In binary CAMs, only two types of bits are stored in the memory cells, a "0" or a"1". A CAM search in the memory array will yield a positive matching result when the value and the position of each bit in the input data are exactly matched in the stored data. In ternary CAMs, a third bit may be stored in the memory cells which is a "don't care" bit (represented by an "x"). In this CAM, a search in the memory array will yield a positive matching result if the value and position of each bit in the input data is exactly matched in the stored data, except for memory cells which store the "don't care" bit which may match both a "0" or a "1" in the input data.

CAM cells typically have included either NOR-type memory cells or NAND-type memory cells using SRAM or DRAM technology. In recent years, CAM technology has been moving towards the use of non-volatile memories (NVMs) such as NAND and NOR flash memories, among other type of NVMs. Examples of CAMs using these types of NVMs are described in US Patent Publication No US 2015/0131383, now issued as U.S. Pat. No. 10,832,746, assigned to the common assignee of the present application.

SUMMARY OF THE PRESENT INVENTION

There is provided, in accordance with an embodiment of the present invention, a memory device which includes a plurality of memory units and a global responder (RSP) unit. Each memory unit includes a memory array of memory cells arranged in rows and columns, and an RSP unit. The memory array receives horizontal input data rotated for storage as data candidates in columns of the array, wherein at least one of the rows of the memory array is a calculation row receiving per-bit-line Boolean AND operations between bits of a marker row and bits of a row of data of the data candidates. The RSP unit includes wired-OR circuitry operative on the at least one calculation row to generate a responder signal indicating whether there is one cell in the at least one calculation row having a predefined value identifying a data candidate in the memory array. The global RSP unit receives multiple responder signals, one from at least two of the RSP units, and performs Boolean OR operations on the multiple responder signals.

Moreover, in accordance with an embodiment of the present invention, the wired-OR circuitry performs Boolean OR operations on bit line data in at least two of the columns of the at least one calculation row to generate the responder signal.

Further, in accordance with an embodiment of the present invention, the plurality of memory units are distributed and the device also includes a connection between the plurality of memory units and the global RSP unit.

Still further, in accordance with an embodiment of the present invention, the connection uses wired or wireless communications.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

It will be appreciated that for simplicity and clarity of illustration, elements shown in the figures have not necessarily been drawn to scale. For example, the dimensions of some of the elements may be exaggerated relative to other elements for clarity. Further, where considered appropriate,

DETAILED DESCRIPTION OF THE PRESENT INVENTION

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

Applicants have realized that the functionality of memory devices with memory arrays suitable for loading input data vertically into columns, as is frequently done in CAMs (content addressable memories), may be increased by using wired-OR circuitry which may generate a signal responsive to positive identification of a data candidate in at least one of the columns. The wired-OR circuitry, hereinafter referred to as RSP (responder) signal circuitry, may perform Boolean OR operations on bit line data in most, if not all, bit lines in the memory array, to generate a RSP signal. This RSP signal may then be used internally in the device to communicate a RSP signal value (RSP value) to the data stored in the array. The RSP signal value, which may be communicated to most, if not all, bit lines in the array may be used to manipulate the data and may be used in an iterative manner to generate new RSP signals to allow additional manipulation of the data. The RSP signal may be used in a wide range of applications such as, for example, database applications including searching and sorting, image processing, energy use control, intrusion detection, horizontal computing, parallel processing, random forest classifying, among many, many more applications.

In an embodiment of the present invention, the RSP signal may be used to perform Min-Max sorting operations inside databases. Using a method where the bit values of all data items stored in the columns are compared on a row-by-row basis to generate a RSP signal indicative of whether or not the row contains a logical "1" value, and by manipulating the data in the row according to the obtained RSP value, Applicants have realized that through an iterative process of elimination, the data item having the maximum value may be determined. Applicants have additionally realized that this method may be used to sort all the data items in the database by initially finding a first maximum, next finding a second maximum, and subsequently repeating the process, until all the data has been sorted from maximum to minimum. This method, Applicants have realized, is particularly advantageous as no shifting of data is required during the sorting process, contrary to known sorting methods which require data shifting. Applicants have additionally realized that the sorting operation may be a constant time operation where the execution time is independent of the number of candidates in the database and is only dependent on the maximum size of the candidates. That is, a maximum number of iterations required to find the candidate having the maximum value is limited by the size of the column occupied by the data candidates.

In some embodiments, the memory device may include an in-memory controller to communicate the RSP values to the data stored in the array, and to process the RSP signals and data accordingly. Additionally or alternatively, the memory device may be an in-memory computational device, for example, as described in U.S. Pat. No. 8,238,173; U.S. Patent Publication No US 2015/0131383, now issued as U.S. Pat. Nos. 10,832,746; and 9,418,719; all assigned to the common assignee of the present application, where processing of the RSP signals and/or the data may be performed inside the memory array without having to take the data out from memory.

In some embodiments, the RSP signal may be output from the device, for example, to a host controller, for further processing. It may additionally be used in a distributed system where each memory device may output an RSP signal which may connect to a global RSP signal for further processing. Applicants have realized that using a single global RSP signal to which the RSP signals from each memory device may connect may eliminate the use of map reduce methods known in the art. The connection between the RSP signals from the distributed memory devices and the global RSP signal may include use of wired and/or wireless communications.

Figure 1A:
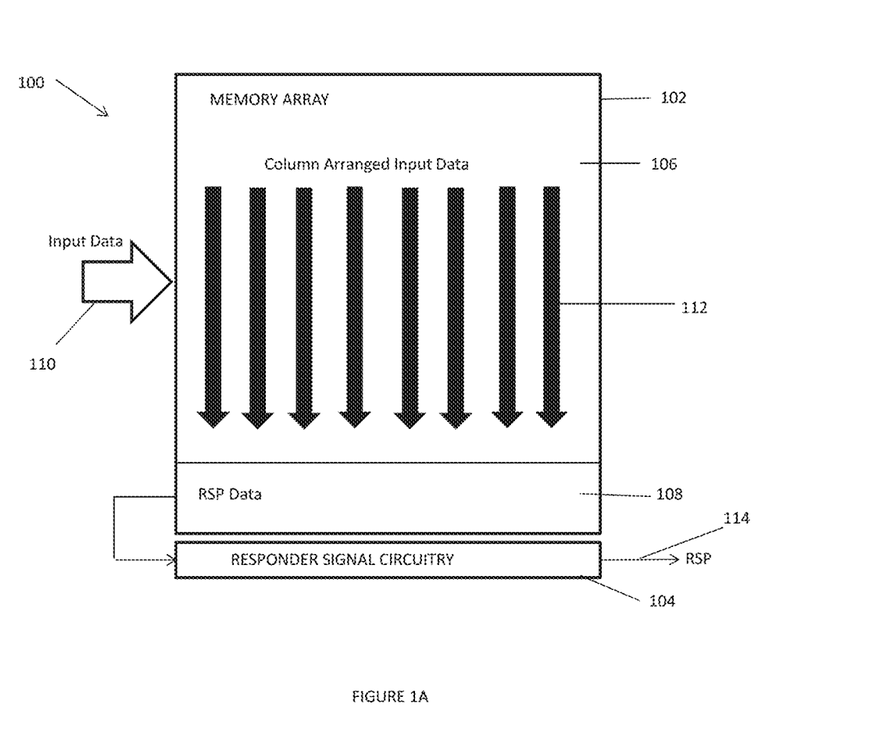
FIG. 1A schematically illustrates an exemplary improved memory device including a memory array and RSP signal circuitry, according to an embodiment of the present invention.

Reference is now made to FIG. 1A which schematically illustrates an exemplary improved memory device 100 including a memory array 102 and RSP signal circuitry 104, according to an embodiment of the present invention. Memory device 100 may additionally include other circuitry (not shown) as may be required for the operation of the device, including for data processing and communication, which may include, for example, a row decoder, sensing circuitry, a controller, input/output buffering, driver circuitry, and precharge circuitry, among other types of circuitry.

Memory device 100 may include a CAM or a T-CAM device, an in-memory computational device, or other type of memory device, which may allow input data transferred horizontally through a bus 110 (e.g. 32-bit bus) to be rotated and loaded into columns in the memory array, as shown by column-arranged input data 112. Examples of these types of memory devices are described in previously mentioned U.S. Pat. No. 8,238,173, U.S. Patent Publication No US 2015/0131383, now issued as U.S. Pat. Nos. 10,832,746, and 9,418,719, all assigned to the common assignee of the present application.

Memory array 102 may include memory cells arranged in rows and columns, with the columns of cells connected together using either NOR-type architecture (for NOR Boolean operations) or a NAND-type architecture (for NAND operations), both of which are known in the art. Examples of such architectures are described in the previously mentioned patents and patent applications assigned to the common assignee of the present invention. The memory cells may include volatile memory cells and/or non-volatile memory cells, of which the non-volatile memory cells may include flash memory cells.

Figure 1B:
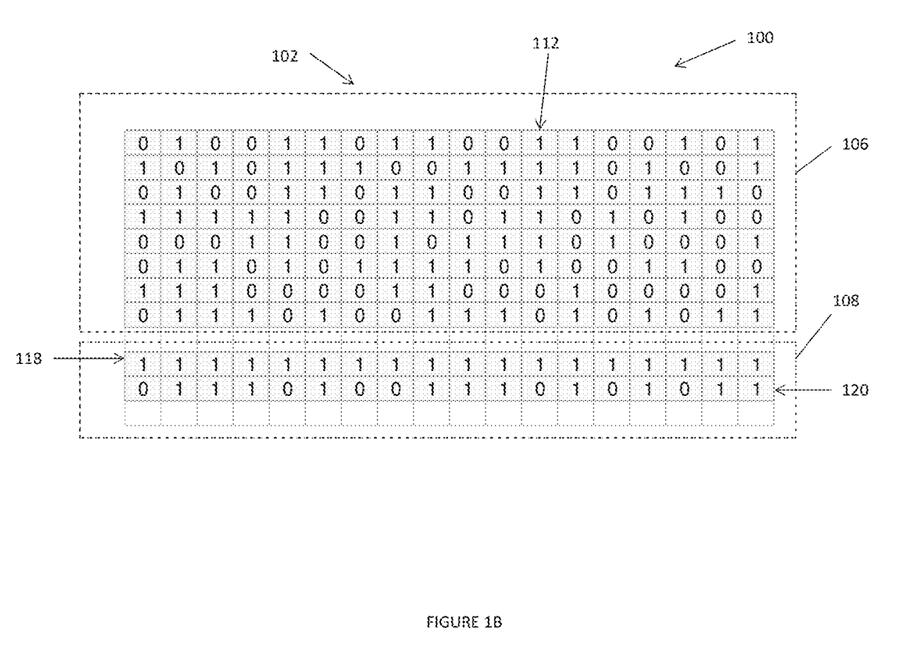
FIG. 1B schematically illustrates an exemplary portion of the memory array with the input data section and RSP data section, according to an embodiment of the present invention.

Memory array 102 may be partitioned into two sections, an input data section 106 which may store column-arranged input data 112, and an RSP data section 108 which may store RSP data. The RSP data may include processed data resulting from the manipulation of the stored data responsive to an obtained RSP value in an RSP signal 114, and may include temporary data which may be updated every time a new RSP signal is generated. An exemplary portion of memory array 102 with input data section 106 and RSP data section 108 is shown in FIG. 1B, according to an embodiment of the present invention. The RSP data may be stored in one or more rows in second array section 108, for example rows 118 and 120, although storing does not necessarily have to be by rows so long as the storage location of every bit in the RSP data is known. Furthermore, memory array 102 may not necessarily have to be partitioned into two sections (106 and 108) rather may be a single section, for example, input data section 106, with the RSP data stored in the input data section.

It may be appreciated that the RSP data does not necessarily require being stored inside memory array 102 rather may be temporarily stored internally in memory device 100 yet externally to the array, for example, in a buffer or other relatively small storage space compared to the memory array. Alternatively, the RSP data may be transferred out of memory (out of memory device 100) for external processing, for example, by an external controller. In both of the above cases, memory array 102 may only include first array section 106.

RSP signal circuitry 104 may include OR-wired circuitry which may generate RSP signal 114 responsive to an OR operation carried out on the RSP data. The RSP data may be arranged in one or more rows in memory array 102, as previously mentioned, but is not limited to this sort of arrangement. RSP signal 114 may include the RSP value which may be equal to "1" if at least one bit in the OR'd RSP data is a "1" or may be equal to "0" if none of the bits in the RSP data include "1". A new RSP signal 114 may be generated by RSP signal circuitry 104 each time the bits in a row (or in a sequence of bits which are to be compared) are OR'd.

It may be appreciated that memory array 102 may also be implemented as a plurality of memory blocks where each block, or alternatively each several blocks, may include associated RSP signal circuitry 104 for generating RSP signal 114 responsive to an OR operation carried out on the RSP data associated with the stored data within the respective block (or several blocks). It may be further appreciated that memory array 102 may be additionally implemented using the MLB architecture described in previously mentioned U.S. Pat. No. 9,418,719, which includes use of multiplexing between MLBs to transfer data between the MLBs. Using such architecture each MLB, or several MLBs, may include associated RSP signal circuitry 104 for generating RSP signal 114.

Figure 2:
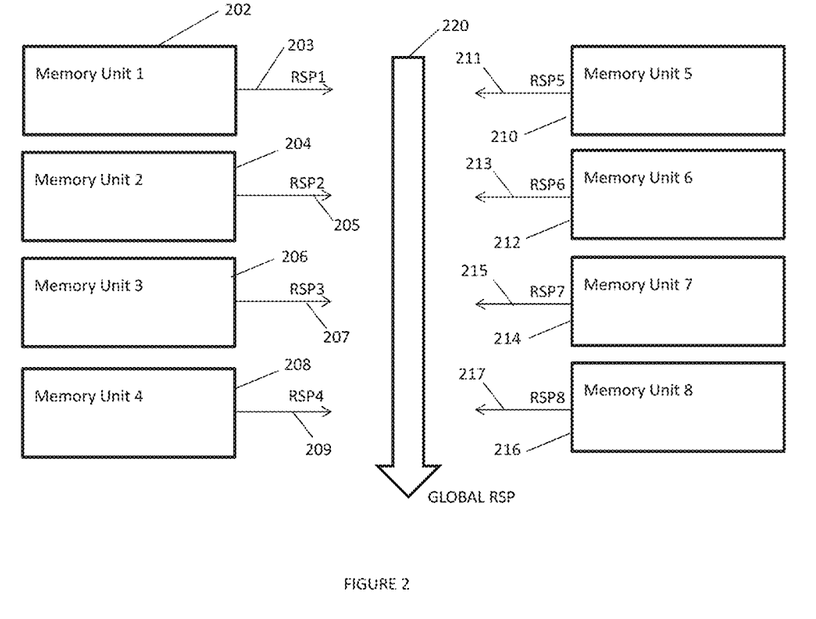
FIG. 2 schematically illustrates an exemplary distributed memory system including a plurality of memory units connected to a global RSP signal, according to an embodiment of the present invention.

Reference is now made to FIG. 2 which schematically illustrates an exemplary distributed memory system 200 including a plurality of memory units 202-216 connected to a global RSP signal 220, according to an embodiment of the present invention. Although shown with only eight memory units, Memory Unit 1 (MU1) 202 though Memory Unit 8 (MU8) 216, distributed memory system 200 may include more or less MUs, for example, less than 5 MUs, less than 3 MUs, or alternatively, more than 10 MUs, more than 100 MUs, more than 1000 MUs, more than 10,000 MUs, more than 100,000 MUs, or more.

MU1 202-MU8 216 may each output an RSP signal, for example, RSP1 203 for MU1, RSP2 205 for MU2 204, RSP3 207 for MU3 206, RSP4 209 for MU4 208, RSP5 211 for MU5 210, RSP6 213 for MU6 212, RSP7 215 for MU7 214, and RSP 217 for MU8 216. RSP1 203-RSP8 217 may each connect to global RSP 220 and may each provide information regarding the RSP value output by its respective MU. Global RSP 220 may transfer a global RSP value based on the received RSP values from RSP signals 203-217, which may be used to allow a global controller (not shown) to manipulate all the data in all the MUs, MU1-MU8. For example, global RSP 220 may transfer a "1" to the global controller if all received RSP values are "1", or may transfer a "0" if all the RSP values are "0". In some cases, global RSP 220 may transfer the individual RSP values output by each MU for individual processing by the global controller. Responsive to global RSP 220, global controller may provide instructions to allow simultaneous and similar manipulation of the data in all the MUs, It may be appreciated that MU1 202-MU8 216 may be physically located in proximity one to another, or distantly located one from the other, or a combination thereof where some may be in proximity and others distant. For example, MU1 202-MU8 216 may represent the MLBs previously described with reference to memory device 100, where all MLBs are located within a same memory device. In an alternative example, each MU1 202-MU8 216 may represent a memory device 100, some of which may be geographically located distant one from the other. The communication of the RSP values to global RSP 220 may include use of wireless and/or wired communication means.

Figure 3:
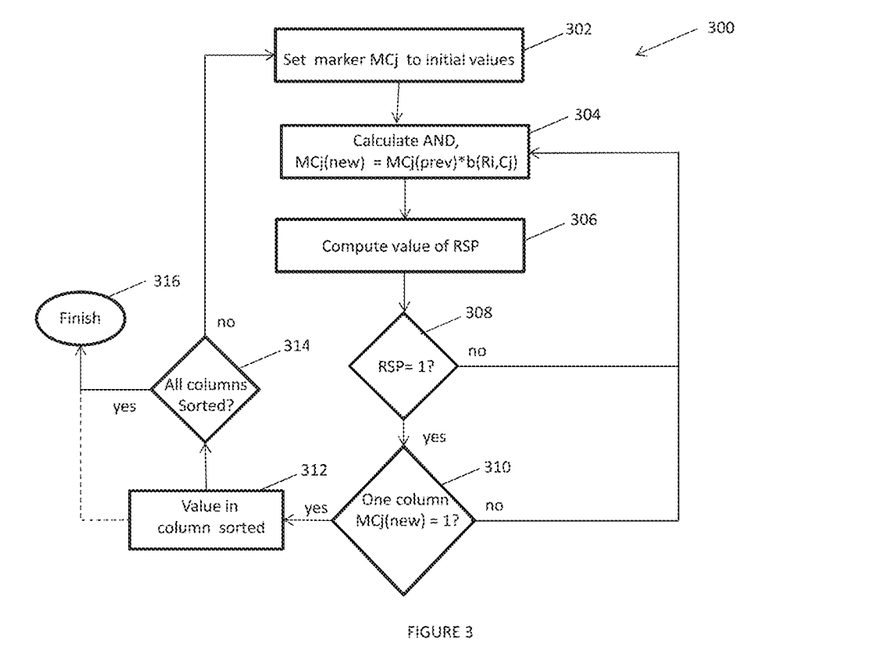
FIG. 3 is a flow chart of an exemplary method of performing a Min-Max, constant time sort operation using an RSP signal, according to an embodiment of the present invention.

Reference is now made to FIG. 3 which is a flow chart of an exemplary method 300 of performing a Min-Max, constant time sort operation using an RSP signal, according to an embodiment of the present invention. The following description of method 300 is for exemplary purposes and the person skilled in the art may appreciate that the method may be practiced with variations. These variations may include more steps, less step, changing the sequence of steps, skipping steps, among other variations which may be evident to one skilled in the art. For clarity in describing method 300, reference is made to memory device 100 shown in FIGS. 1A and 1B, and to FIGS. 4 and 5A-5E.

Figure 4:
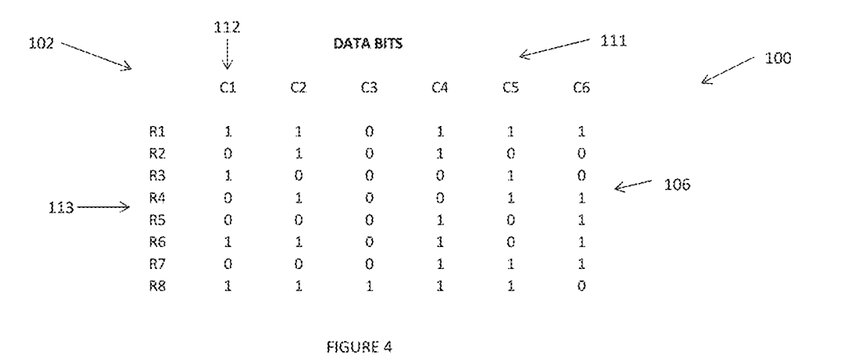
FIG. 4 schematically illustrates a section of the exemplary input data section in the memory array having rows R1-R8 and columns C1-C6, each column including an 8-bit data candidate for sorting from maximum value to minimum value, according to an embodiment of the present invention.

FIG. 4 schematically illustrates a section of exemplary input data section 106 in memory array 102 having rows R1-R8 113 and columns C1-C6 111, each column including an 8-bit data candidate 112 for sorting from maximum value to minimum value, according to an embodiment of the present invention. Each data candidate 112 occupies one column 111 (C1 or C2 or C3 or C4 or C5 or C6) from row R1 to R8 113.

Figure 5A:
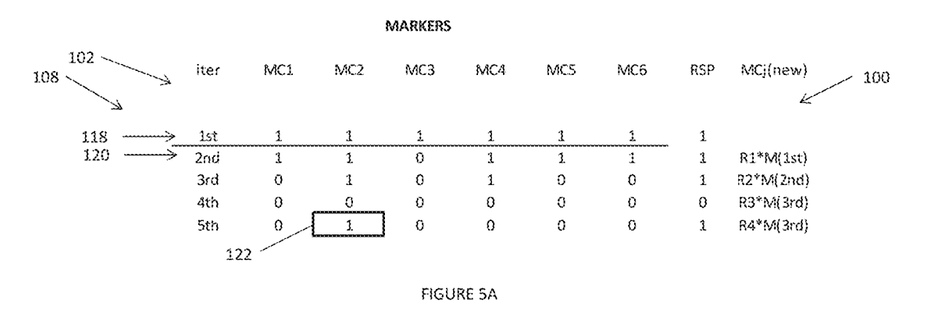
FIGS. 5A-5E schematically illustrate the steps of Min-Max sorting of the data candidates stored in columns C1-C6 through the manipulation of the RSP data inside the RSP data section and through the generation of RSP values by performing OR operations on the RSP data, according to an embodiment of the present invention.

FIGS. 5A-5E schematically illustrate the steps of Min-Max sorting of the data candidates 112 stored in columns C1-C6 through the manipulation of the RSP data inside RSP data section 108 and through the generation of RSP values by performing OR operations on the RSP data, according to an embodiment of the present invention. In descending sorting order (from maximum to minimum), FIG. 5A illustrates the steps for finding the first maximum, FIG. 5B the second maximum, FIG. 5C the third maximum, FIG. 5D the fourth maximum, and FIG. 5E the fifth maximum. The minimum is found through elimination, having found all the other maximums.

In FIGS. 5A-5E, the RSP data are labelled as Markers and may be stored in rows 118 and 120. In row 118 may be stored initial marker bit values which may be used to initiate the maximum value finding process. In row 120 may be stored temporary marker bit values which may be recalculated for each row of data bits in an iterative process based on the computed RSP value. The RSP value is shown in the column labelled RSP for each iteration, and may be the result of an OR operation performed on the marker bits. The iteration number is shown in column labelled "iter". The data in columns labelled MC1-MC6 may each be associated with the data bits in the respective columns C1-C6 and are the marker bit values. In the column labelled MCj (new) are shown the operation which may be performed to calculate new marker bit values in each iteration, and may include performing an AND (Boolean) operation between an input data bit and an associated marker bit (e.g. C1 and MC1) for each row R1-R8. The letter "j" represents the column number (j=1 . . . 6).

Referring now back to FIG. 3:

At 302, initial marker bit values may be set in row 118. For finding the first maximum, all marker bits (MC1-MC6) may be set to "1s". An RSP value equal to 1 (RSP=1) may be generated by RSP signal circuitry by performing an OR operation (MC1+MC2+MC3+MC4+MC5+MC6). This step may be considered the first iteration, iter=1$^{st}$.

At 304, new marker bit values may be computed by performing an AND operation between the previous marker bit values MC1-MC6 (e.g. stored in row 118) and the bit values C1-C6 stored in the row being compared (e.g. R1). The new marker bit values may be temporarily stored in row 120, although as previously mentioned, they may be stored elsewhere inside memory array 102 or even outside the array.

At 306, an OR operation may be performed to compute a RSP value using the new marker bit values. Discard new marker bit values if the RSP value=0.

At 308, a determination may be made if the newly computed RSP=1. If yes, continue. If no, go to 304.

At 310, a determination may be made if there is only one marker bit value=1 in the computed marker bit values. If yes, go to 312. If no, go to 304.

At 312, the data candidate associated with having the only marker bit value=1 is selected as being a maximum value. The data candidate may be marked to indicate that it is a maximum value and the value may be output.

At 314, a determination may be made if all the data candidates have been sorted. If yes, go to 316. If no, return to 302 to determine the next maximum.

At 316, the method is finished and all values have been sorted from maximum to minimum.

In FIG. 5A, the method of FIG. 3 is shown to determine the first maximum. In 302, all marker bit values MC1-MC6 may be set to an initial value of "1" and may be stored in row 118 of RSP data section 108. In a second iteration in 304, new marker bit values are calculated for the bits in row R1 (FIG. 4) by performing an AND operation of the initial values of MC1-MC6 with the bit values C1-C6 in row R1. The new marker bit values may be stored in row 120 in RSP data section 108. The RSP value may be computed, and is equal to "1". As there are marker bits having values of "1" a third iteration is performed for row R2 and new marker bit values MC1-MC6 are calculated. Again, RSP is computed again and is equal to "1". As there are several marker bits with "1's", a fourth iteration is performed and new marker bit values MC1-MC6 are calculated for row R3. In this iteration, all marker bit values are equal to "0" and the computed RSP value is equal to "0". As there are no marker bits equal to "1", a new fifth iteration is performed for row R4. New marker bit values are determined using the previous marker bit values calculated in the prior step (calculated in the third iteration as in the fourth iteration they were all "0"). In the fifth iteration, only one marker bit MC2 122 is equal to "1", and therefore data candidate 112 in column C2, associated with MC2, is the maximum value (the first maximum).

Figure 5B:
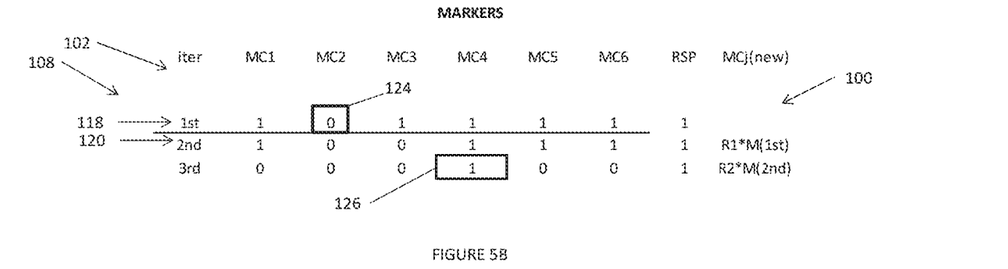

In FIG. 5B is shown the determination of the second maximum. In order to determine the next maximum, the procedure is similar to that shown in FIG. 5A except that the initial marker bit values are all set to "1" except for that associated with the maximum value previously determined at MC2 124, which is set to "0". As may be appreciated from the figure, the next maximum is determined for marker bit MC4 126, which may be associated with the data candidate in column C4.

Figure 5C:
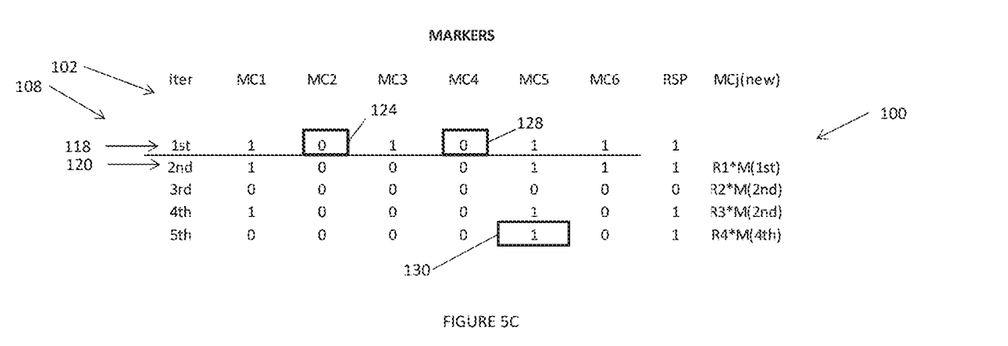

In FIG. 5C is shown the determination of the third maximum. In order to determine the next maximum, the procedure is similar to that shown in FIG. 5B with the initial marker bit values are all set to "1" except for that associated with the maximum values previously determined at MC2 124 and MC4 128, which are set to "0". As may be appreciated from the figure, the next maximum is determined for marker bit MC5 130, which may be associated with the data candidate in column C5.

Figure 5D:
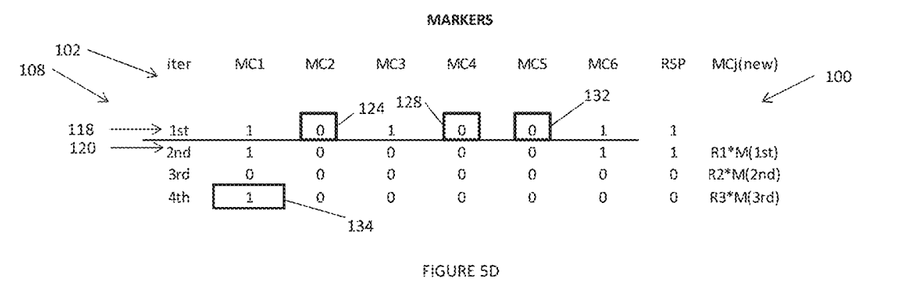

In FIG. 5D is shown the determination of the fourth maximum. In order to determine the next maximum, the procedure is similar to that shown in FIGS. 5B and 5C with the initial marker bit values are all set to "1" except for that associated with the maximum values previously determined at MC2 124, MC4 128 and MC5 132, which are set to "0". As may be appreciated from the figure, the next maximum is determined for marker bit MC1 134, which may be associated with the data candidate in column C1.

Figure 5E:
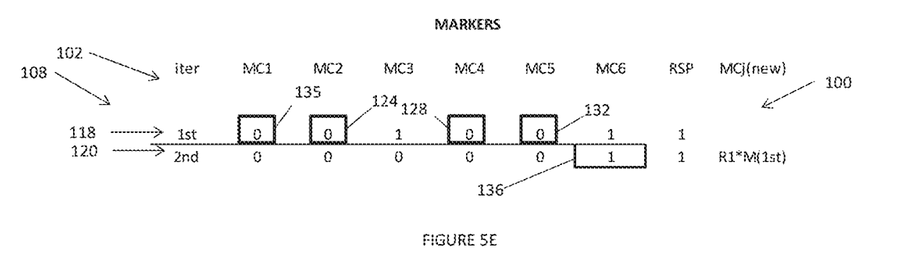

In FIG. 5E is shown the determination of the fifth maximum. In order to determine the next maximum, the procedure is similar to that shown in FIGS. 5B-5D with the initial marker bit values are all set to "1" except for that associated with the maximum values previously determined at MC1 135, MC2 124, MC4 128 and MC5 132, which are set to "0". As may be appreciated from the figure, the next maximum is determined for marker bit MC6 136, which may be associated with the data candidate in column C6. Having determined the five maximums, the minimum may now be extracted by elimination, and is the data candidate in column C3 associated with marker bit MC3.

Unless specifically stated otherwise, as apparent from the preceding discussions, it is appreciated that, throughout the specification, discussions utilizing terms such as "processing," "computing," "calculating," "determining," or the like, refer to the action and/or processes of a computer, computing system, or similar electronic computing device that manipulates and/or transforms data represented as physical, such as electronic, quantities within the computing system's registers and/or memories into other data similarly represented as physical quantities within the computing system's memories, registers or other such information storage, transmission or display devices.

Embodiments of the present invention may include apparatus for performing the operations herein. This apparatus may be specially constructed for the desired purposes, or it may comprise a general-purpose computer selectively activated or reconfigured by a computer program stored in the computer. Such a computer program may be stored in a computer readable storage medium, such as, but not limited to, any type of disk, including floppy disks, optical disks, magnetic-optical disks, read-only memories (ROMs), compact disc read-only memories (CD-ROMs), random access memories (RAMs), electrically programmable read-only memories (EPROMs), electrically erasable and programmable read only memories (EEPROMs), magnetic or optical cards, Flash memory, or any other type of media suitable for storing electronic instructions and capable of being coupled to a computer system bus.

The processes and displays presented herein are not inherently related to any particular computer or other apparatus. Various general-purpose systems may be used with programs in accordance with the teachings herein, or it may prove convenient to construct a more specialized apparatus to perform the desired method. The desired structure for a variety of these systems will appear from the description below. In addition, embodiments of the present invention are not described with reference to any particular programming language. It will be appreciated that a variety of programming languages may be used to implement the teachings of the invention as described herein.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

What is claimed is:

1. A memory device comprising:
a plurality of memory units, each memory unit comprising:
a memory array of memory cells arranged in rows and columns, said columns defined by bit lines, said memory array to receive horizontal input data rotated for storage as data candidates in said columns of said memory array, wherein the rows of the memory array comprise at least one calculation row, each of the at least one calculation row receiving per-bit-line-Boolean AND operations between bits of a marker row and bits of a row of data of said data candidates; and
a responder (RSP) unit comprising wired-OR circuitry operative on said at least one calculation row to generate a responder signal indicating whether there is one cell in said at least one calculation row having a predefined value identifying a data candidate in said memory array; and
a global RSP unit to receive multiple responder signals, one from at least two of said RSP units, and to perform Boolean OR operations on said multiple responder signals.

2. The memory device according to claim 1, said wired-OR circuitry to perform Boolean OR operations on bit line data in at least two of said columns of said at least one calculation row to generate said responder signal.

3. The memory device according to claim 1 wherein said plurality of memory units are distributed and also comprising a connection between said plurality of memory units and said global RSP unit.

4. The memory device according to claim 3 wherein said connection uses wired communications.

5. The memory device according to claim 3 wherein said connection uses wireless communications.

* * * * *